United States Patent
So et al.

(10) Patent No.: US 8,143,360 B2
(45) Date of Patent: Mar. 27, 2012

(54) AQUEOUS DEVELOPABLE BENZOCYCLOBUTENE-BASED POLYMER COMPOSITION AND METHOD OF USE OF SUCH COMPOSITIONS

(75) Inventors: Ying Hung So, Midland, MI (US); Edmund J. Stark, Midland, MI (US); Shellene K. Thurston, Saginaw, MI (US); Kayla J. Gallant (nee Baranck), Bay City, MI (US); Yongfu Li, Midland, MI (US)

(73) Assignee: Dow Global Technologies LLC, Midland, MI (US)

( * ) Notice: Subject to any disclaimer, the term of this patent is extended or adjusted under 35 U.S.C. 154(b) by 833 days.

(21) Appl. No.: 11/665,246

(22) PCT Filed: Oct. 12, 2005

(86) PCT No.: PCT/US2005/036453
§ 371 (c)(1),
(2), (4) Date: Oct. 15, 2008

(87) PCT Pub. No.: WO2006/044338
PCT Pub. Date: Apr. 27, 2006

(65) Prior Publication Data
US 2009/0075205 A1    Mar. 19, 2009

Related U.S. Application Data

(60) Provisional application No. 60/618,549, filed on Oct. 13, 2004.

(51) Int. Cl.
*C08F 32/08* (2006.01)
(52) U.S. Cl. .................... 526/281; 430/286.1
(58) Field of Classification Search .................. 526/281; 430/286.1
See application file for complete search history.

(56) References Cited

U.S. PATENT DOCUMENTS

| | | | |
|---|---|---|---|
| 3,755,354 A | 8/1973 | Holub et al. | |
| 4,540,763 A | 9/1985 | Kirchhoff | |
| 4,724,260 A | 2/1988 | Kirchhoff et al. | |
| 4,783,514 A | 11/1988 | Kirchhoff et al. | |
| 4,812,588 A | 3/1989 | Schrock | |
| 4,826,997 A | 5/1989 | Kirchhoff | |
| 4,999,499 A | 3/1991 | Bhatt | |
| 5,136,069 A | 8/1992 | DeVries et al. | |
| 5,138,081 A | 8/1992 | DeVries et al. | |
| 5,185,391 A | 2/1993 | Stokich, Jr. | |
| 5,238,775 A | 8/1993 | Kajita et al. | |
| 5,243,068 A | 9/1993 | DeVries et al. | |
| 6,071,666 A | 6/2000 | Hirano et al. | |
| 6,361,926 B1 * | 3/2002 | So et al. ............. | 430/287.1 |

FOREIGN PATENT DOCUMENTS

WO    WO 94/25903    11/1994
WO    WO 2004/038505    5/2004

OTHER PUBLICATIONS

R. Dammel, "Diazonaphthoquinone-based Resists", pp. 70-96, SPIE—The International Society for Optical Engineering, Bellingham, Washington (1993).*
Dammel, Ralph; DNQ/Novolak Interactions, Chapter 4, "Diazonaphthoquinone-based Resists"; 1993; vol. TT 11, pp. 70-96; SPIE—The International Society for Optical Engineering, Bellingham, Washington.
Patent Abstracts of Japan, vol. 2003, No. 12, Dec. 5, 2003 and JP 2005 062294 A, Sumitomo Bakelite Co., Ltd.; Mar. 10, 2005.
Patent Abstracts of Japan, vol. 2003, No. 12, Dec. 5, 2003 and JP 2005 062409 A, Sumitomo Bakelite Co., Ltd.; Mar. 10, 2005.

* cited by examiner

*Primary Examiner* — Ling-Siu Choi
(74) *Attorney, Agent, or Firm* — S. Matthew Cairns

(57) ABSTRACT

The invention is a composition comprising a curable arylcyclobutene based oligomer or polymer and a dissolution inhibitor which comprises a compound comprising at least two diazonaphthoquinone (DNQ) moieties each of which is pendant from different phenyl groups.

17 Claims, No Drawings

AQUEOUS DEVELOPABLE BENZOCYCLOBUTENE-BASED POLYMER COMPOSITION AND METHOD OF USE OF SUCH COMPOSITIONS

CROSS-REFERENCE TO RELATED APPLICATIONS

This application is a 371 of PCT/US2005/036453 filed Oct. 12, 2005, which claims the benefit of U.S. Provisional Application Ser. No. 60/618,549, filed Oct. 13, 2004.

This invention relates arylcyclobutene-based polymer compositions that are suitable for development in aqueous solutions.

Benzocyclobutene-based polymers are known to be useful as insulating materials in various electronics and micro-electronics applications. In U.S. Pat. No. 6,361,926 an aqueous developable benzocyclobutene-based polymer was taught. This patent further indicated that various dissolution inhibitors could be used for positive tone articles. Sulfonyl esters of trihydroxybenzophenone such as diazo naphthol sulfonate esters were mentioned as potential dissolution inhibitors.

Applicants have discovered improved positive tone arylcyclobutene-based polymer compositions. Specifically, Applicants have found that arylcylobutene-based polymer compositions comprising dissolution inhibitors characterized by diazonaphthoquinone (DNQ) moieties where there are at least two DNQ groups and each is pendant from different phenyl groups provide better film retention after patterning (exposure and subsequent development in aqueous base). The best balance of properties, however, is obtained when the above dissolution inhibitors are used in a blend with dissolution inhibitors comprising an unsubstituted phenyl group.

Thus, according to one embodiment the invention is a composition comprising a curable arylcyclobutene based oligomer or polymer and a dissolution inhibitor which comprises a compound comprising at least two diazonaphthoquinone (DNQ) moieties each of which is pendant from different phenyl groups. The dissolution inhibitor preferably also comprises a compound comprising at least one DNQ moiety pendant from a phenyl group and at least one unsubstituted phenyl group. A solvent or solvent blend may be used to facilitate thin film formation. Appropriate additives such as antioxidants and coating aids may also be incorporated in the formulation.

The Arylcyclobutene Material

The arylcyclobutene material may comprise a monomer of the formula or, more preferably, partially polymerized product (for example, oligomers or curable polymers) of monomer precursor(s) comprising monomers the formula:

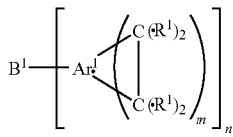

wherein $B^1$ is an n-valent organic linking group, preferably comprising ethylenic unsaturation, or $B^1$ may be absent. Suitable single valent $B^1$ groups preferably have the formula —$CR^8$=$CR^9Z$, wherein $R^8$ and $R^9$ are independently selected from hydrogen, alkyl groups of 1 to 6, most preferably 1 to 3 carbon atoms, and aryl groups, and Z is selected from hydrogen, alkyl groups of 1 to 6 carbon atoms, aryl groups, —$CO_2R^7$ wherein $R^7$ is H, an alkyl group, preferably of up to 6 carbon atoms, an aryl group, an aralkyl group, or an alkaryl group. Most preferably Z is —$CO_2R^7$ wherein $R^7$ is an alkyl group, preferably of up to 6 carbon atoms, an aryl group, an aralkyl group, or an alkaryl group. Suitable divalent $B^1$ groups include —$(CR^8=CR^9)_o$-$(Z')_{o-1}$, wherein $R^8$ and $R^9$ are as defined previously, o is 1 or 2, and Z' is an alkyl group of 1 to 6 carbon atoms, an aromatic group, or a siloxane group. Most preferably o is 2 and Z' is a siloxane group.

$Ar^1$ is a polyvalent aromatic or heteroaromatic group and the carbon atoms of the cyclobutene ring are bonded to adjacent carbon atoms on the same aromatic ring of $Ar^1$. Preferably $Ar^1$ is a single aromatic ring;

m is an integer of 1 or more, preferably 1;

n is an integer of 1 or more, preferably 2-4 and more preferably 2;

$R^1$ is a monovalent group, preferably hydrogen, alkyl of up to 6 carbon atoms.

The synthesis and properties of these arylcyclobutenes, as well as terms used to describe them may be found, for example, in U.S. Pat. Nos. 4,540,763; 4,724,260; 4,783,514; 4,812,588; 4,826,997; 4,999,499; 5,136,069; 5,185,391; and 5,243,068 all of which are incorporated herein by reference.

According to one preferred embodiment, the monomer has the formula:

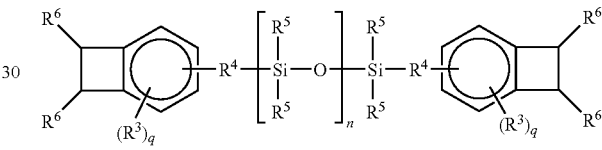

wherein each $R^3$ is independently an alkyl group of 1-6 carbon atoms, trimethylsilyl, methoxy or chloro;

each $R^4$ is independently a divalent, ethylenically unsaturated organic group, preferably an alkenyl of 1 to 6 carbons, most preferably —$CH_2$=$CH_2$—;

each $R^5$ is independently hydrogen, an alkyl group of 1 to 6 carbon atoms, cycloalkyl, aralkyl or phenyl; preferably $R^5$ is methyl;

each $R^6$ is independently hydrogen, alkyl of 1 to 6 carbon atoms, chloro or cyano, preferably hydrogen;

n is an integer of 1 or more;

and each q is an integer of 0 to 3, preferably q is 0 (in which case the benzene ring has 3 hydrogen atoms bonded to it).

The most preferred monomers are 1,3-bis(2-bicyclo[4.2.0] octa-1,3,5-trien-3-yl ethenyl)-1,1,3,3 tetramethyldisiloxane (referred to herein as DVS-bisBCB).

The preferred organosiloxane bridged bisbenzocyclobutene monomers can be prepared by methods disclosed for example in U.S. Pat. Nos. 4,812,588; 5,136,069; 5,138,081 and WO 94/25903.

The arylcyclobutene-based oligomer or polymer comprises acid functionality which enables the material to be developed in aqueous solutions. The acid functionality is preferably present at equivalent weights of up to about 600 grams/mole of acid functionality, more preferably up to about 500 grams/moles of acid functionality. The equivalent weight is preferably at least 100 grams/mole of acid functionality, more preferably at least 200 grams/mole of acid functionality.

One method for providing such acid functionality is to include acid functional monomers along with the preferred monomers, preferably prior to partial polymerization of the materials to form oligomers. This approach is generally taught in U.S. Pat. No. 6,361,926. Suitable acid-containing monomers include the formula:

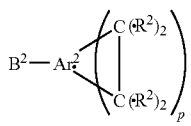

wherein $B^2$ is a monovalent organic group with acid functionality, preferably also containing ethylenic unsaturation;

$Ar^2$ is a polyvalent aromatic or heteroaromatic group and the carbon atoms of the cyclobutene ring are bonded to adjacent carbon atoms on the same aromatic ring of $Ar^2$, preferably $Ar^2$ is a single aromatic ring;

p is an integer of 1 or more, preferably 1;

$R^2$ is a monovalent group, preferably hydrogen, alkyl of up to 6 carbon atoms.

Preferably, such additional monomer is selected from the following two formulas:

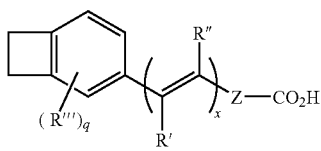

wherein

R' and R" are independently selected from hydrogen, alkyl groups of 1 to 6 carbon atoms, aryl groups, or R' and R" taken together from a cyclic group of 4 to 8 carbon atoms; each R''' is independently an alkyl group of 1-6 carbon atoms, trimethylsilyl, methoxy or chloro;

Z is a carbon to carbon bond or an aryl group;

x is an integer from 0 to 3, preferably 1; and q is an integer of 0 to 3, preferably 0; or

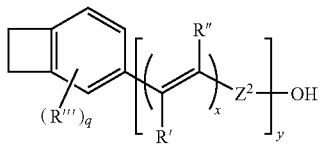

wherein

R' and R" and R''' and q are as defined above, x is 1, y is 0 or 1, and $Z^2$ is an aryl group.

Alternatively a monomer characterized by the presence of a cyclobutarene group and a pendant functionality which at least partially reacts during polymerization of monomers or in subsequent processing to form a pendant acid group. Preferably, this alternative monomer has the formula:

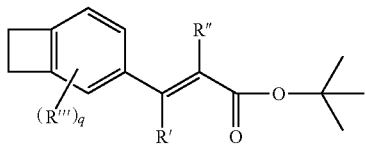

wherein R' and R" and R''' and q are as defined above and R' and R" are preferably hydrogen. When the above monomer, which can be prepared by a palladium-catalyzed reaction of bromobenzocyclobutene and t-butyl acrylate, is polymerized, the resulting polymer has both acrylate ester and acrylic acid functionalities.

Alternative approaches for including acid functionality may also be used, such as are taught in WO 04/038505.

The arylcyclobutene materials are preferably B-staged (that is partially polymerized). Other components may be added before or after B-staging. B-staging preferably occurs in solvent but may occur neat (that is without solvent). B-staging preferably occurs at a temperature in the range of about 125 to about 250° C., more preferably about 130 to about 200° C. The polymerization may occur for a time determined to provide a partially polymerized resin that provides the desired properties with regard to subsequent processability. Preferably, the curable product has an apparent weight average molecular weight (Mw) as determined by Gel Permeation Chromatography (GPC) in the range of at least about 1000, more preferably at least about 1500, more preferably still at least about 2000 and most preferably at least about 5000 g/mol. The Mw of arylcyclobutene oligomers is preferably less than about 50,000, more preferably less than about 35,000, more preferably still less than about 20,000, and most preferably less than about 10,000 g/mol.

The Dissolution Inhibitor

The dissolution inhibitor preferably includes a compound of the formula:

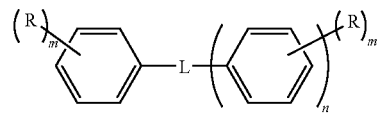

Where

L is an n+1 valent linking group. Preferably L is a covalent bond, S, O, C(=O), or a hydrocarbyl group of 1 to 12, preferably 1 to 10, and more preferably 1-6 carbon atoms. Most preferably, L is an alkyl group of 2 to 4 carbon atoms, R is independently in each occurrence OH or OY provided at least some R, more preferably at least about 40% of R, more preferably still at least 50% of R, and most preferably at least about 60% of R are OY, where OY indicates a pendant DNQ group, preferably a sulfonate ester of DNQ, m is independently in each occurrence an integer of 1 to 3, preferably 2 or 3, and n is 1 or 2.

A preferred, but non-limiting example of this compound is a diazonaphthoquinone sulfonate ester of 1,1,1-tris(4-hydroxyphenyl)ethane (THPE). The formula may be represented as follows:

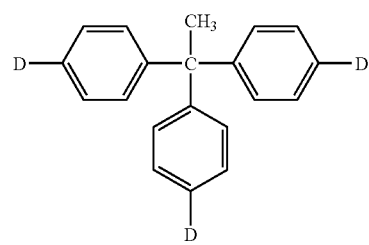

where

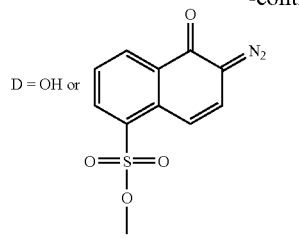

Preferably, the dissolution inhibitor further comprises a second compound of the formula:

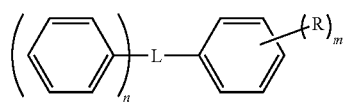

where L, R, m, and n are as defined above. A preferred, but non-limiting example of this compound is a diazonaphthoquinone sulfonate ester of 2,3,4-trihydroxybenzophenone (THBP). This may be represented by the formula:

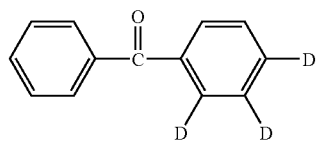

where D is as defined above. This component provides the desired solubility in the preferred solvents and good compatibility with the arylcyclobutene polymer.

The mole ratio of the first compound above to the second compound above (when the second compound is used) in the dissolution inhibitor composition preferably is no more than about 99:1, more preferably no more than about 90:1, more preferably still no more than about 70:1, more preferably still no more than about 10:1, more preferably still about 5:1. The mole ratio of the first compound to the second compound is preferably at least about 1:5, more preferably at least about 1:2.

For illustrative purposes only which should not be considered limiting of the scope of the invention, the dissolution inhibitor composition could be made as follows:

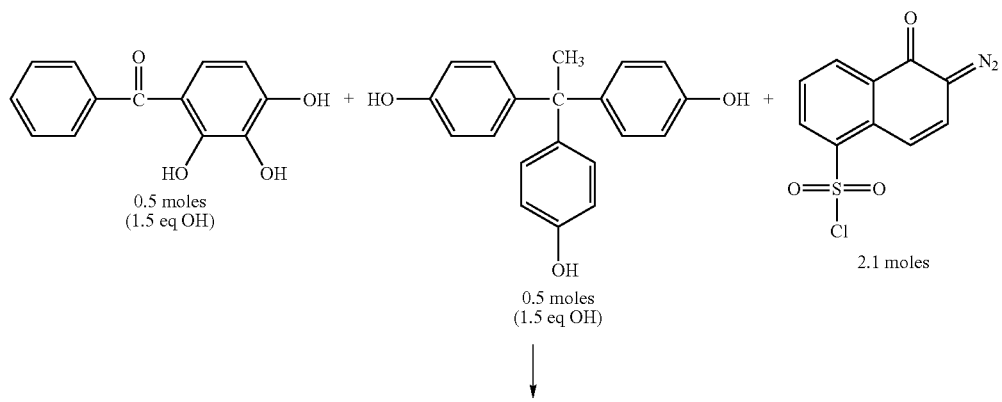

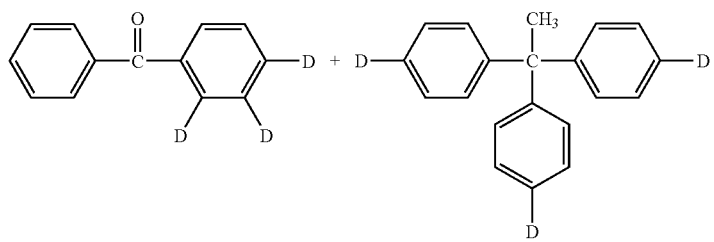

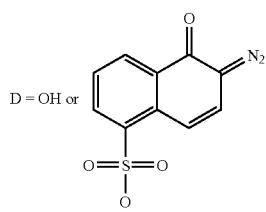

Diazonaphthoquinone (DNQ) sulfonate ester is made from the reaction of a phenol with DNQ sulfonyl chloride. The mole ratio of phenol functional group to sulfonyl chloride is 1 to 0.7 in the DNQ that we currently use. As a result of the stoichiometry, we have many compounds from the reaction, especially when we consider the possible isomers in THBP.

The amount of dissolution inhibitor added to the composition is preferably at least 5 percent by weight, more preferably at least 10 percent by weight, and most preferably at least 15 percent by weight based on weight of the benzocyclobutene-based component. The amount is preferably no greater than 30 weight percent, more preferably no greater than 25 weight percent, and most preferably no greater than 20 weight percent based on weight of the benzocyclobutene-based component.

Other Components

The arylcyclobutene and dissolution inhibitor formulation may preferably also include various other components.

Solvents are useful as a means to facilitate application of the formulation to substrates to form thin films. Suitable solvents include, but are not limited to aromatic hydrocarbons such as toluene, xylene and mesitylene; $C_3$-$C_6$ alcohols; methylcyclohexanone; N-methylpyrrolidinone; dimethylacetamide, ethoxyethylpropionate, ethyl lactate, butyrolactone; and glycol-based solvents including (but not limited to) dipropylene glycol dimethyl ether isomers (commercially available from The Dow Chemical Company as Proglyde™ DMM), propylene glycol methyl ethyl acetate (PGMEA), and Dowanol™ DPMA (di(propylene glycol) methyl ether acetate isomers available from The Dow Chemical Company). A mixture of Proglyde™ DMM and PGMEA is preferred.

It may be convenient to select solvents such that they can dissolve the monomers prior to B-staging (that is partial polymerization) and the dissolution inhibitors as well as serve as a suitable solvent carrier for the partially polymerized product formulation for coating purposes.

Other components that may be used include antioxidants, coating aids, adhesion promoters, fillers and the like.

Any antioxidant useful with benzocyclobutene resins may be used. Antioxidants with hindered phenol functionality are among the preferred materials. Particularly preferred are 4-[[4,6-bis(octylthio)-1,3,5-triazin-2-yl]amino]-2,6-bis(1,1-dimethylethyl)-phenol, and 2,4-bis(1,1-dimethylethyl)-, phosphite (3:1) phenol.

Suitable coating aids include commercially available materials such as Modaflow. Particularly preferred are copolymers of the ethyl ester of 2-propenoic acid with 2-ethylhexyl 2-propenoate.

Suitable adhesion promoters may also be used. Particularly preferred adhesion promoters are silyls of maleamic or citraconic acid. The silyls of maelamic acid have the formula:

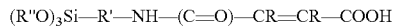

where R is independently in each occurrence H or a monovalent lower alkyl (preferably of 1-4 carbon atoms), and R' is independently in each occurrence a divalent lower alkyl (preferably of 1-6 carbon atoms), and R" is a monovalent lower alkyl (preferably of 1-4 carbon atoms). N-[3-(triethoxysilyl)propyl]maleamic acid and N-[3-(triethoxysilyl)propyl]citraconic acid are examples of preferred adhesion promoters.

Processing

The compositions are preferably coated onto a substrate from one of the solvents mentioned above. Any solvent coating method may be used, but spin-coating is preferred. A soft-bake to remove solvent is preferably performed at temperatures of up to about 100° C. for times of about ten minutes or less. The temperature may be higher if a shorter time is used and the time may be longer if relatively low temperatures are used.

The coated compositions are then image-wise exposed to activating wavelengths of radiation so as to deactivate the dissolution inhibitor. The exposed portions of the coated film may then be removed with an appropriate developer solution such as an aqueous base solution. The preferred pH is in the range of 12 to 14. Examples of suitable developers include NaOH, LiOH, KOH, RbOH, CsOH, tetramethyl ammonium hydroxide (Me$_4$NOH), Et$_4$NOH.

After development, the remaining composition is hard cured by baking at temperatures of preferably up to about 300° C., preferably greater than about 200° C.

EXAMPLE 1

To 13.52 g of 29% BCB-acrylic acid and DVS-bisBCB copolymer with mole ratio of 67.5 to 32.5 in di(propylene glycol)methyl ether acetate (Dowanol DPMA) was added 0.748 g of THBP with 45% DNQ sulfonate ester (16 wt % based on weight of BCB-based components). By 45% DNQ sulfonate ester of THBP means that approximate 45% of the hydroxyl groups on the THBP have been reacted with DNQ sulfonyl chloride to form the sulfonate ester. The solution was filtered with a 1 micron syringe filter. AP3000 was applied to a 4 inch silicon wafer followed by baking on a hot plate at 150° C. for 90 seconds. The BCB solution was applied to the wafer followed by spreading at 500 rpm for 10 seconds and spin-coating at 2100 rpm for 30 seconds. The wafer was baked at 95° C. for 5 minutes. Film thickness after bake was 4.550 micron. The wafer was exposed with a Karl Suss exposure tool with a dose of 300 mJ/cm$^2$. The exposed wafer was developed in a 2.38% tetramethylammonium hydroxide bath. Development time was 45 seconds. Film thickness after development was 3.22 micron, film retention being 70.8%. Film thickness after cure was 2.72 micron, 59.8% from initial film thickness. Substantially the same procedure was followed but THPE with 40% DNQ sulfonate ester was used instead of the THBP with 45% DNQ sulfonate ester. Film retention after development and after cure were 78.4% and 72.4%, respectively. The same experiment was performed with THPE with 60% DNQ sulfonate ester, film retention after development and after cure were 85.6% and 72.3%, respectively. This demonstrates the increased effectiveness in regard to film retention of the THPE based DNQ sulfonate esters as compared to THBP based DNQ sulfonate esters.

Solubility Test. One gram of THPE with 60% DNQ sulfonate ester was mixed with 10 g of PGMEA. The mixture had to warm to 60° C. to make a homogeneous solution. One gram of THPE with 60% DNQ sulfonate ester was mixed with 5 g of PGMEA. The mixture did not produce a homogeneous solution even with warming to above 60° C. Solubility of THPE with 70% sulfonate ester is lower than that of THPE with 60% sulfonate ester in PGMEA. One gram of a 1 to 1 mixture of THBP and THPE with 60% or 70% DNQ sulfonate ester was completely dissolved in 5 g of PGMEA. This demonstrates that THPE sulfonate ester is less soluble than DNQ sulfonate esters from mixtures of THPE and THBP.

EXAMPLE 2

An arylcyclobutene-based oligomer was prepared by heating 398.6 g of BCB-acrylic acid and 481.4 g of DVS-bisBCB in 1320 g of Proglyde DMM until a Mw of 5702 g/mol was reached. Initial BCB-acrylic acid to DVS-bisBCB mole ratio was 65 to 35. BCB content was 40%. The prepolymer (8.485 g) was placed in an amber vial. DNQ (0.602 g, 15 wt % based on BCB prepolymer) prepared from a 1 to 1 mole mixture of THPE and THBP with 70% equivalent of sulfonyl chloride was added to 6.25 g of PGMEA. The DNQ readily dissolved in PGMEA to produce a homogenous solution. The solution was added to the amber vial containing the prepolymer. The solution was filtered through a 1 micron syringe filter. AP3000 was applied to a 4 inch silicon wafer followed by baking on a hot plate at 150° C. for 90 seconds. The BCB solution was applied to the wafer followed by spreading at 500 rpm for 10 seconds and spin-coating at 1000 rpm for 30 seconds. The wafer was baked at 95° C. for 2 minutes. Film thickness after bake was 3.626 micron. The wafer was exposed with a Karl Suss exposure tool with a dose of 200 mJ/cm$^2$. The exposed wafer was developed in a 2.38% tetramethylammonium hydroxide bath. Development time was 74 seconds. Film thickness after development was 3.139 micron, film retention being 86.6%.

EXAMPLE 3

Sample 1: An arylcyclobutene-based oligomer with Mw of 6123 g/mol was prepared in a similar fashion as described in Example 2. Initial BCB-acrylic acid to DVS-bisBCB mole ratio was 65 to 35. BCB content was 40 wt % in Proglyde DMM. The preplymer (4.10 g) was placed in an amber vial. Progylde DMM (0.50 g) and PGMEA (3.61 g) were added to reduce BCB content to 20 wt %. The wt ratio of Proglyde DMM to PGMEA in the solution became 45 to 55. DNQ sulfonate ester (0.36 g) prepared from a 1 to 1 mole mixture of THBP and THPE with 60% equivalent of DNQ sulfonyl chloride (M-60) (that is 0.6 equivalents of DNQ sulfonyl chloride was used for every 1 equivalent of hydroxyl functionality in the THBP and THPE mixture) was added, wt percentage of M-60 being 18. A wafer was processed in a similar fashion as described in Example 2. Film retention after development with TMAH was 91.9%. Film quality was good.

This experiment was repeated with various photoactive agents as shown in the table below. Samples 1, 3, 5, 7, and 9 were run on the same day. Samples 2, 4, 6, 8, and 10 were run on the same day but on a different day from the first set of samples. Samples 11, 12, and 13 were run on separate days.

| Samples | Photoactive agent used (at 18% by weight based on weight of BCB components | film retention after development, % | film quality | film retention after cure. % |
|---|---|---|---|---|
| 1 | THPE-70 | 93 | good | 82.5 |
| 2 | THPE-70 | 91.9 | hazy | 81.7 |
| 3 | THPE-80 | 100 | hazy | 79 |
| 4 | THPE-80 | 96.4 | hazy | 80.3 |
| 5 | THBP-90 | 95.3 | flakes during development | 80.5 |
| 6 | THBP-90 | 97.2 | hazy | 79 |
| 7 | M-60 | 91.9 | good | 70.5 |
| 8 | M-60 | 91 | some hazy | 79.7 |
| 9 | M-70 | 91.1 | good | 80 |
| 10 | M-70 | 90.6 | good | 79.1 |
| 11 | THBP-60 | 75.8 | good | 65.9 |
| 12 | THBP-70 | 76 | good | 70.16 |
| 13 | THBP-80 | 85.3 | good | 75.23 |

Legend:
M-60: defined above
M-70: a 1 to 1 mole mixture of THBP and THPE. Approximately 70% of the hydroxyl groups will have reacted with DNQ sulfonyl chloride.
THPE-70: THPE with about 70% of the hydroxyl groups reacted with DNQ sulfonyl chloride.
THPE-80: THPE with about 80% of the hydroxyl groups reacted with DNQ sulfonyl chloride.
THBP-60: THBP with about 60% of the hydroxyl groups reacted with DNQ sulfonyl chloride.
THBP-70: THBP with about 70% of the hydroxyl groups reacted with DNQ sulfonyl chloride.
THBP-80: THBP with about 80% of the hydroxyl groups reacted with DNQ sulfonyl chloride.
THBP-90: THBP with about 90% of the hydroxyl groups reacted with DNQ sulfonyl chloride.

EXAMPLE 4

An arylcyclobutene-based oligomer was prepared by heating 398.6 g of BCB-acrylic acid and 481.4 g of DVS-bisBCB in 1320 g of Proglyde™ DMM until a Mw of 5216 g/mol was reached. Initial BCB-acrylic acid to DVS-bisBCB mole ratio was 65 to 35. BCB content was 40%. 579.9 g of this solution was weighed into an amber glass jar. Phenol, 4-[[4,6-bis (octylthio)-1,3,5-triazin-2-yl]amino]-2,6-bis(1,1-dimethylethyl)-(4.88 g, available as Irganox 565 from Ciba Specialty Chemicals), phenol, 2,4-bis(1,1-dimethylethyl)-, phosphite (3:1) (4.88 g, available as Irgafos 168 from Ciba Specialty Chemicals), and additional Proglyde™ DMM (22.8 g) was added, and the contents were mixed. DNQ sulfonate ester (52.5 g) prepared from a 1 to 1 mole mixture of THBP and THPE with 70% equivalent of DNQ sulfonyl chloride (M-70) (that is 0.7 equivalents of DNQ sulfonyl chloride was used for every 1 equivalent of hydroxyl functionality in the THBP and THPE mixture) was dissolved in PGMEA (466.5 g), and the solution was combined with the previous solution and mixed. A 15% solution of 2-propenoic acid, ethyl ester, copolymer with 2-ethylhexyl 2-propenoate (1.55 g, available as Modaflow from Surface Specialties UCB, Smyrna, Ga. 30080) was mixed into the formulation. The formulation was stored in a refrigerator, filtered with three passes through a 0.45 micron filter membrane, and bottled. AP3000 was applied to a 4 inch silicon wafer followed by baking on a hot plate at 150° C. for 90 seconds. The BCB formulation was applied to the wafer followed by spreading at 500 rpm for 10 seconds and spin-coating at 1000 rpm for 30 seconds. The wafer was baked at 85° C. for 2 minutes. Film thickness after bake was 3.05 microns. The wafer was exposed with a Karl Suss exposure tool with a dose of 250 mJ/cm$^2$. The exposed wafer was developed in a 2.38% tetramethylammonium hydroxide bath. Development time was 63 seconds. Film thickness after development was 2.77 micron, film retention being 90.7%. Film thickness after cure (210° C./90 min) was 2.31 micron, 75.5% from initial film thickness. The sample had no striations.

EXAMPLE 5

To a 500 mL amber jar was placed 150 g of benzocyclobutene (BCB)-based prepolymer which consisted of 39.22 wt % of BCB-acrylic acid and DVS-bisBCB copolymer with mole ratio of 65 to 35, 59.14 wt % of di(propylene glycol)

dimethylether (Proglyde DMM), 0.82 wt % of Irganox 565, and 0.82 wt % of Irgafos 168. Diazonaphthoquinone (DNQ) sulfonyl ester of α-α-α'-tris(4-hydroxyphenyl)-1-ethyl-4-isopropylbenzene (12.93 g. Approximately two thirds of the hydroxyl groups on α-α-α'-tris(4-hydroxyphenyl)-1-ethyl-4-isopropylbenzene have been reacted with DNQ sulfonyl chloride to form the sulfonyl ester.), propylene glycol monoether acetate (PGMEA) (81.09 g), Proglyde™ DMM (18.68 g), N-[3-(triethoxysily)propyl]maleamic acid solution (2.94 g, 50 wt % N-[3-(triethoxysily)propyl]maleamic acid in PGMEA), and Modaflow (0.26 g, 20 wt % Modaflow in PGMEA) were added to the jar The triethoxysilyl propyl maleamic acid can be made by drop-wise adding maleic anhydride dissolved in PGMEA to a flask of 3-aminopropyltriethoxysilane with stirring. Exothermic heat may be removed by ice-water bath and maintain the reaction temperature below 40° C. by controlling rate of addition of the maleic anhydride.) The jar was shaken to form a homogeneous solution. The solution was filtered through a 0.45 μm filter.

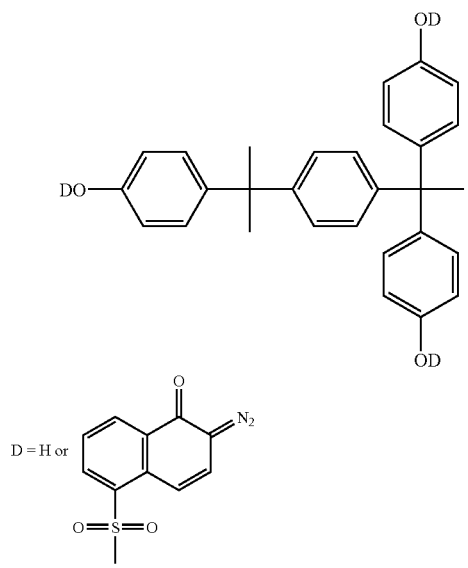

DNQ sulfonyl ester of α-α-α'-tris(4-hydroxyphenyl)-1-ethyl-4-isopropylbenzene

The solution was applied to a 4 inch silicon wafer followed by spreading at 500 rpm for 10 seconds and spin-coating at 1250 rpm for 30 seconds. The wafer was baked at 85° C. for 2 minutes, and then cured in an air circulated oven at 210° C. for 90 minutes. The same experiment was repeated on a silicon nitride wafer.

The wafers were subjected to the modified edge-lift-off test (m-ELT) (Transactions of the ASME, 122, 28-33, 2000). No delamination failure was observed on both substrates. $K_{1c}$ values were 0.51 MPa√m on silicon substrate and 0.55 MPa√m on silicon nitride substrate. Cross-hatched tape feel tests conducted before and after 48 hours in a steam pressure cooker at 121° C. and 1 atm above atmospheric pressure at 100% relative humidity (JEDEC 22, Method A102B) gave 5B ratings for thin films on silicon and silicon nitride.

The solution was applied to a 4 inch silicon wafer followed by spreading at 500 rpm for 10 seconds and spin-coating at 1250 rpm for 30 seconds. The wafer was baked at 85° C. for 2 minutes. Film thickness after bake 3.162 μm. The wafer was exposed with a Karl Suss exposure tool with a dose of 200 mJ/cm². The exposed area was developed in a 2.38% tetramethylammonium hydroxide (TMAH) bath. Development time was 70 seconds. Film thickness after development was 2.803 μm, film retention being 88.6%. The wafer was cured in an air circulated oven at 21° C. for 90 minutes. Film thickness after cure was 2.60 μm (82% film retention).

EXAMPLE 6

To a 500 mL amber jar was placed 78.2 g of benzocyclobutene (BCB)-based prepolymer which consisted of 39.22 wt % of BCB-acrylic acid and DVS-bisBCB copolymer with mole ratio of 65 to 35, 59.14 wt % of di(propylene glycol) dimethylether (Proglyde™ DMM), 0.82 wt % of Irganox 565, and 0.82 wt % of Irgafos 168. Diazonaphthoquinone (DNQ) sulfonyl ester of α-α-α'-tris(4-hydroxyphenyl)-1-ethyl-4-isopropylbenzene (6.67 g. Approximately two thirds of the hydroxyl groups on α-α-α'-tris(4-hydroxyphenyl)-1-ethyl-4-isopropylbenzene have been reacted with DNQ sulfonyl chloride to form the sulfonyl ester.), propylene glycol monoether acetate (PGMEA) (18.69 g), and Modaflow (0.11 g, 20% Modaflow in PGMEA) were added to the jar. The jar was shaken to form a homogeneous solution. The solution was filtered through a 1 μm filter.

The solution was applied to a 4 inch silicon wafer followed by spreading at 500 rpm for 10 seconds and spin-coating at 1750 rpm for 30 seconds. The wafer was baked at 95° C. for 3 minutes. Film thickness after bake was 6.467 μm. The wafer was exposed with a Karl Suss exposure tool with a dose of 300 mJ/cm². The exposed area was developed in a 2.38% tetramethylammonium hydroxide (TMAH) bath. Development time was 155 seconds. Film thickness after development was 5.793 μm, film retention being 89.6%. The wafer was cured in an air circulated oven at 210° C. for 90 minutes. Film thickness after cure was 5.032 μm (77.8% film retention).

What is claimed is:

1. A composition comprising
   a) an acid functionalized, curable arylcyclobutene-based polymer or oligomer,
   b) a dissolution inhibitor comprising a compound of the formula:

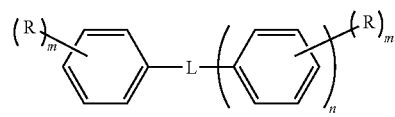

where L is an n+1 valent linking group,
R is independently in each occurrence OH or OY provided that 40% to 80% of R are OY, where OY indicates a pendant DNQ group,
m is independently in each occurrence an integer of 1 to 3, and
n is 1 or 2.

2. The composition of claim 1 wherein the dissolution inhibitor further comprises a compound of the formula:

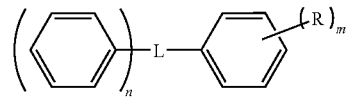

where L is an n+1 valent linking group,
R is independently in each occurrence OH or OY provided at least some R are OY, where OY indicates a pendant DNQ group,
m is independently in each occurrence an integer of 1 to 3, and
n is 1 or 2.

3. The composition of claim 1 wherein L is independently in each occurrence a covalent bond, S, O, C(=O), or a hydrocarbyl group of 1 to 12 carbon atoms.

4. The composition of claim 1 wherein L is a hydrocarbyl group of 1 to 12 carbon atoms.

5. The composition of claim 1 where at least about 50% of R are OY.

6. The composition of claim 2 where at least about 60% of R are OY.

7. The composition of claim 1 further comprising an organic solvent.

8. The composition of claim 7 where the solvent is a mixture of di(propylene glycol) dimethyl ether and propylene glycol methyl ether acetate.

9. The composition of claim 1 further comprising at least one antioxidant.

10. The composition of claim 1 further comprising at least one coating aid.

11. The composition of claim 1 further comprising at least one adhesion promoter.

12. The composition of claim 9 where the antioxidant is selected from 4-[[4,6-bis(octylthio)-1,3,5-triazin-2-yl]amino]-2,6-bis(1,1-dimethylethyl)-phenol, and 2,4-bis(1,1-dimethylethyl)-phenol phosphite (3:1).

13. The composition of claim 10 where the coating aid is a copolymer of the ethyl ester of 2-propenoic acid with 2-ethylhexyl 2-propenoate.

14. The composition of claim 11 where the adhesion promoter is selected from N-[2-(triethoxysilyl)propyl]maleamic acid and N-[3-(triethoxysilyl)propyl]citraconic acid.

15. The composition of claim 1 wherein the acid functionality comprises a —COOH group.

16. The composition of claim 1 wherein the dissolution inhibitor has the formula:

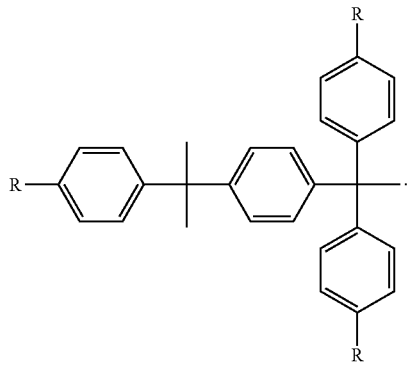

17. The composition of claim 16 wherein two-thirds of the R groups are OY.

* * * * *